US00RE44455E

(19) United States
(12) Reissued Patent
Mueller

(10) Patent Number: US RE44,455 E
(45) Date of Reissued Patent: Aug. 27, 2013

(54) MEASURING ARRAY

(75) Inventor: Burkhard Mueller, Kassel (DE)

(73) Assignee: SMA Solar Technology AG, Niestetal (DE)

(21) Appl. No.: 13/212,859

(22) Filed: Aug. 18, 2011

Related U.S. Patent Documents

Reissue of:
(64) Patent No.: 7,576,547
Issued: Aug. 18, 2009
Appl. No.: 11/803,195
Filed: May 14, 2007

(30) Foreign Application Priority Data

May 16, 2006 (DE) ..... 10 2006 022 686

(51) Int. Cl.
*G01R 31/08* (2006.01)
*H01H 31/02* (2006.01)

(52) U.S. Cl.
USPC ..... 324/522; 324/555

(58) Field of Classification Search
USPC ..... 324/523, 522, 512, 500, 527, 541, 324/544, 551, 555, 557
See application file for complete search history.

(56) References Cited

U.S. PATENT DOCUMENTS 4,392,026 A * 7/1983 Kojima et al. ..... 379/30
4,952,871 A * 8/1990 Driller et al. ..... 324/754.03
6,753,692 B2 * 6/2004 Toyomura et al. ..... 324/718
6,927,955 B2 * 8/2005 Suzui et al. ..... 361/42
6,952,103 B2 * 10/2005 Herb et al. ..... 324/500
7,079,406 B2 * 7/2006 Kurokami et al. ..... 363/56.03

FOREIGN PATENT DOCUMENTS

| | | |
|---|---|---|
| DE | 1 513 510 | 9/1969 |
| DE | 35 13 849 C2 | 10/1986 |
| EP | 0 833 423 A2 | 4/1998 |
| EP | 1 265 076 A1 | 12/2002 |
| EP | 1 437 600 | 7/2004 |
| GB | 1 504 181 | 3/1978 |
| WO | 96/05516 | 2/1996 |
| WO | 2004/093284 | 10/2004 |

* cited by examiner

*Primary Examiner* — Hoai-An D Nguyen
(74) *Attorney, Agent, or Firm* — Slater & Matsil, L.L.P.

(57) ABSTRACT

The measuring array with an earth connection point (5) for determining the insulation resistance ($R_{iso}$) of an energized electrical apparatus or of an installation with a supply voltage $U_B$ with a positive pole (6) and a negative pole (7), two switches ($S_1$, $S_2$) or a corresponding two-way switch being provided for creating a current path between one of the two poles and said earth connection point (5) in order to determine the insulation resistance ($R_{iso}$) generally obtained when one or a plurality of insulation faults occur at any potential reference, two measurements being performed one after the other for determining the insulation resistance, the first switch ($S_1$) being closed and the second switch ($S_2$) open during the first of these two measurements and the first switch ($S_1$) being open and the second switch ($S_2$) closed during the second of these measurements.

34 Claims, 3 Drawing Sheets

MEASURING ARRAY

Matter enclosed in heavy brackets [ ] appears in the original patent but forms no part of this reissue specification; matter printed in italics indicates the additions made by reissue.

CROSS-REFERENCE TO RELATED APPLICATIONS

This application claims Priority from German Application No. DE 10 2006 022 686.0-35 filed on 16, May 2006

FIELD OF THE INVENTION

The invention relates to a measuring array with an earth connection point for determining the insulation resistance ($R_{iso}$) of an energized electrical apparatus or of an installation with a supply voltage ($U_B$) with a positive pole and a negative pole, two switches ($S_1$ and $S_2$) or a corresponding two-way switch being provided for creating a current path between one of the two poles and the earth connection point in order to determine the insulation resistance ($R_{iso}$) generally obtained when one or a plurality of insulation faults occur at any potential reference.

In electrical installations, faults due to moisture, dirt, shorts or other causes may occur in the insulation between a voltage-carrying installation part and earth.

In grounded electrical installations, such a fault immediately results in a current flow in the earth connection so that the insulation may e.g., be monitored by measuring the current in the earth connection so as to immediately remedy the fault. In ungrounded equipment or installations in which the earth connection only occurs through connection with another grounded installation (e.g., connection to the public mains) or through contact with an installation part, monitoring is more difficult. Here, at first, an insulation fault does not result in a current flow. But if the installation is contacted (at another point), the double connection to earth causes a current circuit, in which dangerous body currents may flow, to close. A similar problem arises if the installation is connected to a grounded apparatus: in this case a current flows through the two apparatus which it may damage. In order to avoid such faults, it is advisable to regularly measure the insulation resistance of the installation in order to allow for appropriate measures to be taken in case it falls below a limit value.

Various equivalent network diagrams (ESB) are widely used to represent the insulation state of voltage-carrying equipment or of a voltage-carrying installation. In installations consisting but of a positive and a negative pole, such as third rail systems, it is sensible to combine all the earth faults at the positive pole in one resistance $R_p$ and all the earth faults at the negative pole in one resistance $R_n$ (FIG. 2). In apparatus in which any kind of intermediate potentials occur, such as in a photovoltaic generator for example, it may be more advisable to use an equivalent network diagram of the insulation resistance $R_{iso}$ and the potential $U_x$ at which an earth fault occurs. In principle, both equivalent network diagrams are equivalent and may be converted into each other, $R_{iso}$ for example corresponding to the connection in parallel of $R_n$ and $R_p$. Failure cases with a plurality of earth faults at different potentials may also be detected through both equivalent network diagrams. $R_{iso}$ thereby always corresponds to the connection in parallel of all the leakage resistances, whilst $U_x$ or the ratio $R_n/R_p$ gives some clue as to the location of the earth faults.

The insulation resistance is easy to measure if only one insulation fault $R_p$ occurs between the positive pole and earth or if an insulation fault $R_n$ occurs between the negative pole and earth. For this purpose, it suffices to connect earth (PE) to the two poles through respective known high-impedance resistances $R_{aux1}$, $R_{aux2}$ and to measure two of the three voltages positive pole to earth ($U_1$)

earth to negative pole ($U_2$)

positive pole to negative pole ($U_B$)

(FIG. 2). One of the three voltages can be obtained from the two others and needs not be measured. Since $R_p$ or $R_n$ is parallel to one of the known high-impedance resistances, the value of the parallel connection and as a result thereof the value of $R_n$ or $R_p$ may be found by the voltage divider rule.

If insulation faults $R_p$ and $R_n$ occur concurrently, the described method is no longer operative since it only allows for finding one value $R_n$ or $R_p$. An earth fault occurring at a potential different from the positive or the negative pole can no longer be described with an equivalent network diagram representing only one resistance.

DESCRIPTION OF THE PRIOR ART

Hence, the document EP 1 265 076 describes an widened method in which the above measurement is first performed before a known resistance is connected between earth and one of the two poles via a switching element, then voltage measurements are performed. The disadvantage of this array is the poor measurement accuracy if a low-impedance insulation fault is to be determined in parallel to the connected branch. By connecting the known high-impedance resistance in parallel, the voltage conditions vary but slightly so that the change in voltage that is to be evaluated is very small compared to the measurement range of the voltage measurement. Accordingly, the relative measurement error increases a lot.

A low-impedance insulation fault may be better evaluated if e.g., in case of an insulation fault from positive to earth, the known high-impedance resistance is connected to the negative pole and vice versa. In the document DE 35 13 849, is this is provided in this manner, the additional measurement with the switch being closed being only performed when the measurement with open switches yields values exceeding limit values. It is not ensured that earth faults which do not occur directly at the positive or at the negative pole but at potentials in between said poles will be found with this method. For example, an earth fault in the center of a photovoltaic generator would not lead to a change in the voltage measured when the switches are open so that there would be no reason to perform a measurement with the switch being closed, the earth fault remaining undetected as a result thereof. In the drawings in DE 35 13 849 two-way switches are illustrated, said switches possessing a central position, i.e., the function corresponds to the function of two individual switches that cannot be closed at the same time. The method is for example known for monitoring the insulation resistances of an electrical installation with an earth-free current supply of a telecommunication or signalling system. Racks for accommodating grounded components are provided.

The document EP 0 833 423 describes the same electrical array as the document DE 35 13 849, the measurement procedure being however generally defined so that one measurement cycle comprises one measurement with two open switches and one measurement with one open and one closed switch. The document does not indicate which one of the two switches is to be closed; appropriately, this decision will be taken like in the document DE 35 13 849. Assuming that ideal measurement systems are provided, any earth fault may be exactly determined with this method. For this purpose, the computation rules indicated in the document are used:

$$R_{L1} = R_s\left(\frac{v_1}{v_2} \cdot \frac{v_2'}{v_1'} - 1\right)$$

$$R_{L2} = R_s\left(\frac{v_2'}{v_1'} - \frac{v_2}{v_1}\right)$$

The disadvantage thereof is that for computing the leakage resistances $R_n(R_{L1})$ and $R_p$ $(R_{L2})$, it is necessary to measure two respective instantaneous values of two different voltages and to know the exact value of the additionally connected resistance. Since in practice all the measurands are afflicted with an error, the measurement errors of the two voltages enter into the computed resistance values.

This array is for example utilized in a DC system for the London Underground.

BRIEF SUMMARY OF THE INVENTION

The object of the invention is to provide a measurement array that allows for exact measurement of the insulation resistance $R_{iso}$ even if leakage resistances respectively occur simultaneously to positive and to negative $R_p$ and $R_n$ or if a leakage resistance occurs at an intermediate potential. In order to keep the influence of possible measurement errors low, it is intended to make use of the smallest possible number of measurands for computing $R_{iso}$.

In accordance with the invention, this object is solved by the features of claim 1. For this purpose, the measurement procedure has been changed over the method described in the document EP 0 833 423 in such a manner that a measurement cycle comprises both one measurement with the switch $S_1$ being open and the switch $S_2$ being closed and one measurement with the switch $S_2$ being open and the switch $S_1$ being closed.

In a first implementation of the invention in accordance with claim 2, the rest of the structure may remain unchanged, two high-impedance resistances $R_s$ with a known, equal value being more particularly used in series with the two switches. As may be readily incurred and verified, the leakage resistances $R_n$ and $R_p$ may then be determined through the relations $$R_p = R_S\left(\frac{U_2}{U_2'} - 1\right)$$

$$R_n = R_S\left(\frac{U_1'}{U_1} - 1\right)$$

The variables $U_1$, $U_2$ without prime represent measured values with the switch $S_1$ being closed and the switch $S_2$ being open, whilst the variables with prime $U_1'$, $U_2'$ are given for the measured values with the switch $S_1$ being open and the switch $S_2$ closed. In the nomenclature of the document EP 0 833 423, the following relations would be obtained $$R_{L1} = R_s\left(\frac{v_2}{v_2'} - 1\right)$$

-continued $$R_{L2} = R_s\left(\frac{v_1'}{v_1'} - 1\right)$$

Only one measurand and, as a result thereof, only one measurement error is included in both equations so that the measurement accuracy is improved. In order to determine the value for $R_{iso}$ the parallel connection must be determined in the known manner from $R_n$ and $R_p$.

The measurement array of the invention allows for high accuracy in measuring the insulation resistance. By switching the switches in accordance with the invention, the equations obtained are very easy to handle for fast and easy computation through a computing unit.

A major advantage of the invention is that high accuracy measurement is also possible in case of several leakage resistances. Meaning, the measurement array is also perfectly operative if leakage resistances $R_n$ and $R_p$ occur at the same time or if an insulation error occurs at a point that is not located on the positive or the negative pole, for example in the center of a solar generator. With a simple prior art array as described in FIG. 2, the calculated insulation resistances would be higher than in reality so that the user would feel erroneously safe. Even with the improved arrays according to the documents EP 1 265 076, DE 35 13 849 and EP 0 833 423, the possibly to achieve measurement accuracy is poorer so that the improved measurement of the invention requires less safety loadings, this meaning that the failure frequency of the installation is reduced at a limit value for $R_{iso}$ that is to be observed. Accordingly, the operator of the installation is offered an installation that is more available and more secure at the same time.

In a second implementation of the invention in accordance with claim 3, the two voltage measurement systems may be replaced with only one current measurement apparatus between the connection point of the two switches and earth (FIG. 4). Then, the two resistances $R_s$ are no longer needed for measurement so that their tolerances will no longer be included in the measurement accuracy. Like in the first implementation, the measurement is run so that a PE conductor (earth) is connected successively, via a switching component, for example a relay, to the positive and to the negative pole of the supply voltage, the respective currents in the switched connections being now measured.

If $I_{PE}$ is the current when switch $S_1$ is closed and switch $S_2$ open and $I_{PE}$, the current when switch $S_2$ is closed and $S_1$ open, we have $$R_n = \frac{U_B}{I_{PE}}$$

$$R_p = \frac{U_B}{-I_{PE}'}$$

$$R_{iso} = \frac{U_B}{I_{PE} - I_{PE}'}$$

Due to the difference measurement, an offset error of the current measurement has no influence on the calculated $R_{iso}$ value so that measurement accuracy is again improved.

In a preferred third embodiment in accordance with claim 4 of the invention, the complex potential free current measurement is relocated to one of the two poles of the installation so that the evaluation is easier to perform by a microprocessor having a corresponding reference potential (FIG. 5). For this purpose, a switch $S_2$ is not connected directly to a pole, but via a current source that needs a supply voltage that is negligible compared to the operating voltage $U_B$. This supply voltage is made available by an accordingly actuated transistor, e.g., by a bipolar transistor having the highest possible current amplification or by a field effect transistor. The collector or drain connection of the transistor is connected to the connection of the second switch $S_1$ that is not connected with PE. A current measurement system is connected between this connection point and the second pole. If $I_{pos}$ is the current when the switch $S_1$ is closed and the switch $S_2$ open and if $I_{pos}'$ is the current when the switch $S_2$ is closed and the switch $S_1$ open, one has $$R_n = \frac{U_B}{I_{pos} - I_{const}}$$

$$R_p = \frac{U_B}{-I_{pos}' + I_{const}}$$

$$R_{iso} = \frac{U_B}{I_{pos} - I_{pos}'}$$

Again, thanks to the difference measurement, both offset errors of the current measurement and scatterings of the current source do not enter into the calculation so that here also the measurement accuracy obtained is high. For ease of measurement evaluation by a microcontroller, the current $I_{pos}$ may be lead through a shunt that is connected to an AC/DC converter in the microcontroller. The microcontroller may then register one after the other the measurement values for $U_B$, $I_{pos}$ and $I_{pos}'$ and calculate $R_{iso}$.

The measurement of the insulation resistance in photovoltaic installations for producing electric energy is particularly advantageous. By precisely monitoring earth faults, the hazard to people or sensitive electronic equipment can be detected in time even if several insulation faults occur at different potentials.

The utilization of the measurement array of the invention in transformerless inverters is particularly advantageous. For these inverters, low-impedance earth faults also constitute a hazard if they occur in the center of the generator since they virtually short-circuit the inverter output. The resulting high currents may damage or destroy the high-performance semiconductors. Although damages to the semi-conductors of the inverter may be avoided by other safety provisions such as current monitoring, the fault cause would not be displayed. The search for the fault would then be tedious and cost-intensive without the measurement of the insulation resistance. The measurement of the insulation resistance of the invention is capable of displaying the fault in time and of preventing the need for additionally connecting the inverter to the public mains. The invention allows in particular to reliably protect transformerless inverters and to efficiently shorten down times.

Further advantageous implementations of the invention will become apparent from the dependent claims.

The invention will be described in closer detail herein after with respect to the drawings.

DETAILED DESCRIPTION OF THE INVENTION

Figure 1:
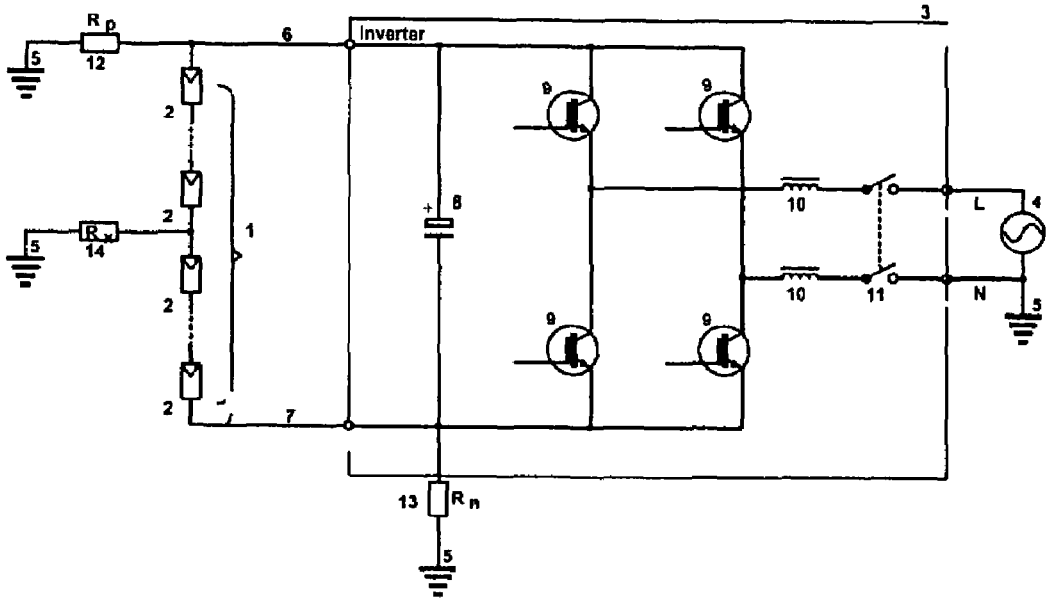
FIG. 1 shows the structure of a mains-connected photovoltaic installation with insulation faults.

FIG. 1 shows a mains-connected photovoltaic installation as an example for an installation that is to be monitored with respect to insulation faults. The constituent parts of the installation are a photovoltaic generator 1 made of a plurality of solar cells 2 and an inverter 3 that is connected to an AC network 4 connected to earth 5. The installation has a positive pole 6 and a negative pole 7. The inverter 3 consists for example of a buffer capacitor 8, of high-performance semiconductors 9, of storage throttles 10 and of an apparatus for connection to the mains 11.

Other examples of possible insulation faults in the photovoltaic generator or inverter illustrated herein are a leakage resistance $R_p$ 12 between the positive pole 6 and earth 5, a leakage resistance $R_n$ 13 between the negative pole 7 and earth 5 as well as a leakage resistance $R_x$ 14 from any potential to earth 5. The following applies:

$$R_{iso} = \frac{1}{\frac{1}{R_p} + \frac{1}{R_n} + \frac{1}{R_x}}$$

If the installation parts are touched, the existing insulation faults lead to body currents that constitute a hazard to people. If connected to the mains, a current flows through the entire installation, which may damage or destroy the components of the installation.

Figure 2:
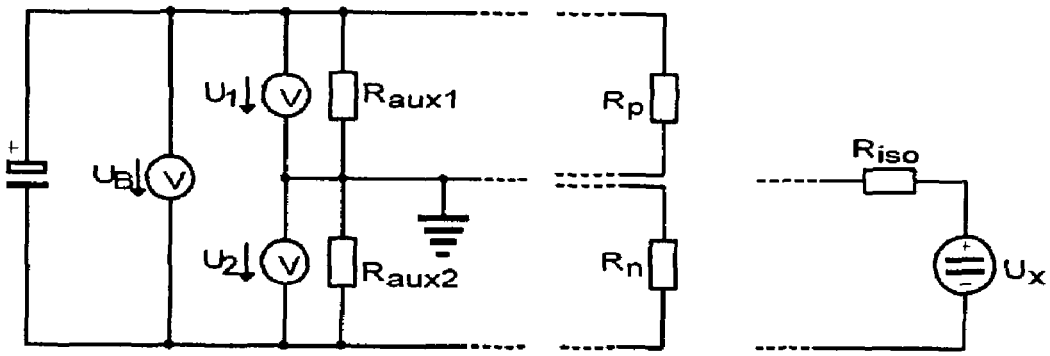
FIG. 2 shows the equivalent network diagram of an installation with a simple measurement array for determining one single leakage resistance $R_n$ or $R_p$.

One single insulation fault at the positive or the negative pole, i.e., one single leakage resistance $R_p$ or $R_n$ can be determined with a simple array according to FIG. 2. Auxiliary resistances $R_{aux1}$ and $R_{aux2}$ are needed for this purpose. Since $R_p$ or $R_n$ is parallel to one of the known high-impedance resistances $R_{aux1}$ and $R_{aux2}$, the value of the parallel connection and as a result thereof the value of $R_p$ or $R_n$ can be determined using the voltage divider rule.

Figure 3:
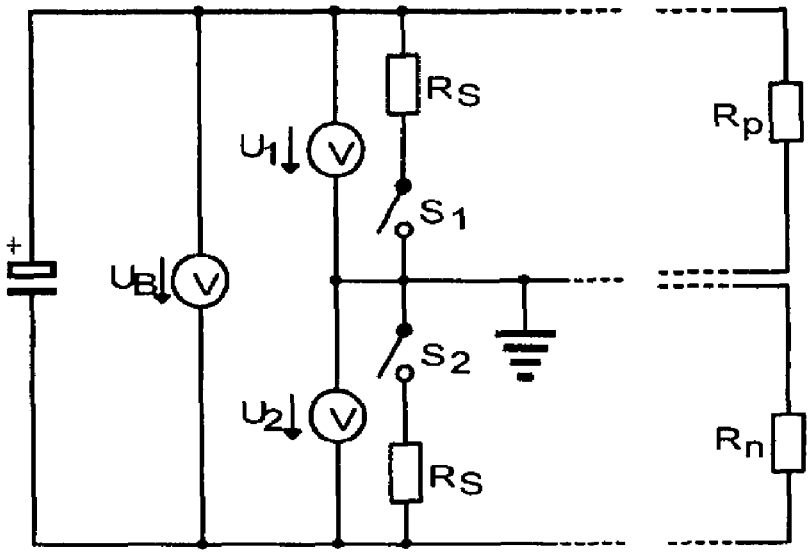
FIG. 3 shows an illustration of the invention in a first implementation with voltage measurement.

FIG. 3 shows a first embodiment of the invention. The structure shown is also used in the document EP 0 833 423. In accordance with the invention, a measurement cycle is defined thus that a first measurement is performed with the switch $S_1$ being closed and the switch $S_2$ open and that next a second measurement is performed with the switch $S_2$ being closed and the switch $S_1$ open. As already mentioned, this results in simple equations with little fault influence.

Figure 4:
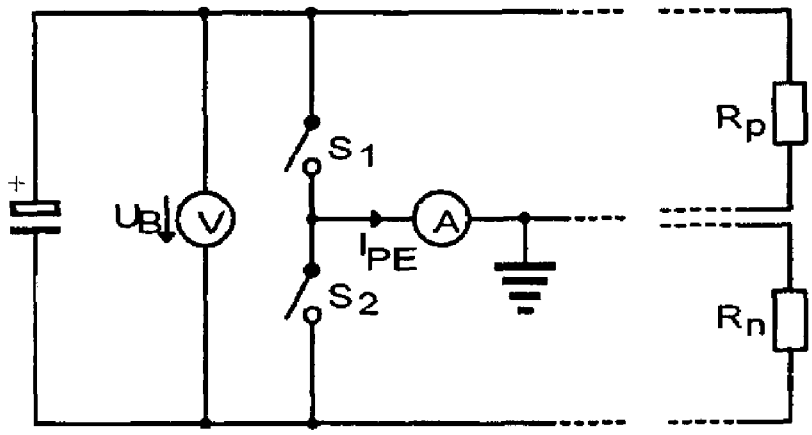
FIG. 4 shows an illustration of the invention in a second implementation with current measurement.

FIG. 4 shows a second embodiment of the invention. A current measurement system is hereby provided between earth 5 and the connection point of the two switches in order to measure the current for calculating the insulation resistance. The measurement cycle remains unchanged with respect to the rule in FIG. 3.

Figure 5:
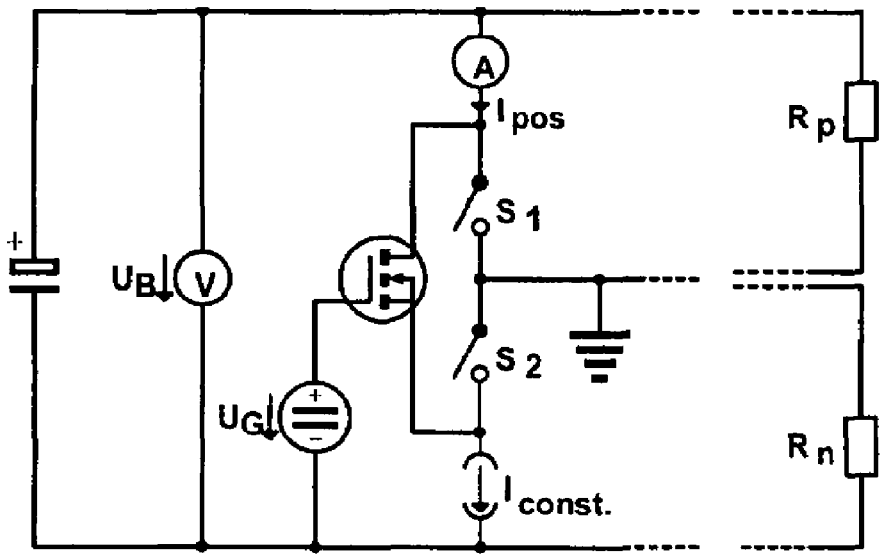
FIG. 5 shows an illustration of the invention in a third implementation with indirect current measurement using a constant current source and a transistor.

FIG. 5 shows a preferred third embodiment of the invention. Here, the current measurement performed is indirect. The circuit makes use of an additional constant current source that supplies the constant current $I_{const}$. The switch $S_2$ is not directly connected to the positive pole, but via the current source. In addition thereto, a MOSFET having an appropriate actuation $U_G$ is connected in parallel with the two switches $S_1$ and $S_2$. The advantage thereof is that, instead of measuring the current $I_{PE}$ with respect to earth 5, a current $I_{pos}$ is measured with respect to the positive pole of the installation. Thus the current may be measured readily, e.g., via a shunt, with a microprocessor the reference potential of which is located on this pole. Like in the implementation in FIG. 4, this solution allows for accurate measurement without highly accurate resistances.

With the method discussed and the measurement arrays described, the insulation resistance $R_{iso}$ of an energized electrical equipment or installation can be determined with a positive pole 6 and a negative pole 7. Upon closing, both switches $S_1$, $S_2$ create a current path between earth and a respective one of the two poles 6, 7. This array allows for detecting insulation faults at both poles 6, 7 at any potential therein between as well as any combination of these faults. The insulation resistance generally obtained can be very accurately determined in a simple way.

LIST OF NUMERALS

1 photovoltaic generator
2 solar cells
3 inverter
4 AC network
5 earth (PE)
6 positive pole
7 negative pole
8 buffer capacitor
9 high-performance semi-conductor
10 storage throttle
11 apparatus for mains connection
12 current source
13 transistor
$R_{iso}$ insulation resistance
$R_p$ leakage resistance at the positive pole
$R_n$ leakage resistance at the negative pole
$R_x$ leakage resistance at intermediate potential
$U_B$ operating voltage of the installation from the positive pole to the negative pole
$U_x$ equivalent voltage for describing the location of insulation faults
$U_1$ voltage between positive pole and earth
$U_2$ voltage between earth and negative pole
$R_{aux1}$ first auxiliary resistance in simple measurement circuit
$R_{aux2}$ second auxiliary resistance in simple measurement circuit
$S_1$ first switch
$S_2$ second switch

I claim:

1. A measuring array with an earth connection point for determining an insulation resistance ($R_{iso}$) of an energized electrical apparatus or of an installation including a supply voltage $U_B$ with a positive pole and a negative pole, the measuring array comprising:

two switches (S1, S2) or a corresponding two-way switch being provided for creating a current path between one of the two poles and said earth connection point in order to determine the insulation resistance ($R_{iso}$) generally obtained when one or a plurality of insulation faults occur at any potential reference;

a current measuring system connected between the connection point of the two switches (S1, S2) and the earth connection point;

a microcontroller configured for determining the insulation resistance by performing two measurements one after the other, in which during the first of these two measurements, the first switch (S1) is closed whilst the second switch (S2) is open, and during the second of these measurements, the first switch (S1) is open whilst the second switch (S2) is closed; and said microcontroller is further configured for measuring a current between the connection point of the two switches (S1, S2) and the earth connection point so that the currents measured at that point during the two measurements are used to calculate the insulation resistance ($R_{iso}$), wherein the insulation resistance ($R^{iso}$) is calculated from $R_{iso}=U_B/(I_{PE}-I_{PE}')$wherein $I_{PE}$ is the current measured with the current measuring system with switch S1 Being closed and switch S2 being open, and $I_{PE}'$ is the current measured with the current measuring system with switch S2 being closed and switch S1 being open.

2. The measuring array as set forth in claim 1, wherein a microcontroller or a microprocessor is provided for calculating the insulation resistance ($R_{iso}$).

3. Use of a measuring array as set forth in claim 1 for measuring the insulation resistance in photovoltaic installations for producing electric energy.

4. Use of a measuring array as set forth in claim 1 for measuring the insulation resistance in inverters, in solar inverters in particular.

5. Use of a measuring array as set forth in claim 1 for measuring the insulation resistance in transformerless inverters.

6. A measuring array with an earth connection point for determining an insulation resistance ($R_{iso}$) of an energized electrical apparatus or of an installation including a supply voltage $U_B$ with a positive pole and a negative pole, the measuring array comprising:

two switches (S1, S2) or a corresponding two-way switch being provided for creating a current path between one of the two poles and said earth connection point in order to determine the insulation resistance ($R_{iso}$) generally obtained when one or a plurality of insulation faults occur at any reference;

a current measuring system connected between the connection of one of the two switches (S1, S2) that is not connected to the earth connection point and one of the two poles, and the connection of the other switch that is not connected to the earth connection point is connected to the other one of the two poles through a constant current source;

a transistor mounted in parallel to the two switches in such a manner that its emitter or source connection is connected to the current source whilst its collector or drain connection is connected to the current measuring system;

a microcontroller configured for determining the insulation resistance by performing two measurements one after the other, in which during the first of these two measurements, the first switch (S1) is closed whilst the second switch (S2) is open, and during the second of these measurements, the first switch (S1) is open whilst the second switch (S2) is closed; and said microcontroller is further configured for calculating the insulation resistance ($R_{iso}$) based on the currents measured with the current measuring system during the two measurements.

7. The measuring array as set forth in claim 6, wherein the insulation resistance $R_{iso}$ is calculated from $R_{iso}=U_B/(I_{pos}-I_{pos}')$, wherein $I_{pos}$ is the current measured with the current measuring system with switch $S_1$ being closed and switch $S_2$ being open and $I_{pos}'$ is the current measured with the current measuring system with switch $S_2$ being closed and switch $S_1$ being open.

8. The measuring array as set forth in claim 7, wherein the current $I_{PE}$ or $I_{pos}$ is measured via a shunt.

9. The measuring array as set forth in claim 6 wherein the switches ($S_1$, $S_2$) are relay switches or semi-conductor switches.

10. Use of a measuring array as set forth in claim 6 for measuring the insulation resistance in photovoltaic installations for producing electric energy.

11. Use of a measuring array as set forth in claim 6 for measuring the insulation resistance in inverters, in solar inverters in particular.

12. Use of a measuring array as set forth in claim 6 for measuring the insulation resistance in transformerless inverters.

*13. A method for determining an insulating resistance ($R_{iso}$) of a circuit, the circuit having a first switch between a positive node and an earth connection point and a second switch between a negative node and the earth connection point, the circuit further comprising a current measuring element connected between a connection node between the first switch and the second switch and the earth connection point, the method comprising:*

*providing a supply voltage ($U_B$) between the positive node and the negative node;*

*measuring a first current ($I_{PE}$) with the current measuring element, wherein the first current is measured when the first switch is closed and the second switch is open;*

*measuring a second current ($I_{PE'}$) with the current measuring element, wherein the second current is measured when first switch is open and second switch is closed; and*

*calculating the insulating resistance ($R_{iso}$) according to $R_{iso}=U_B/(I_{PE}-I_{PE'})$ by a microcontroller or microprocessor.*

*14. The method according to claim 13, wherein the first switch and the second switch are embodied in a two way switch.*

*15. The method according to claim 13, wherein the first switch is a relay or a semiconductor switch, and wherein the second switch is a relay or a semiconductor switch.*

*16. The method according to claim 13, wherein the current measuring element is a shunt.*

*17. A circuit having a positive node, a negative node and an earth connection point, the circuit comprising:*

*a first switch between the positive node and the earth connection point;*

*a second switch between the negative node and the earth connection point;*

*a current measuring element connected between the earth connection point and a connection node between the first switch and the second switch; and*

*a microcontroller configured to perform a first current measurement when the first switch is closed and the second switch is open, and a second current measurement when the first switch is open and the second switch is closed,*

*wherein the microcontroller is further configured to calculate an insulation resistance ($R_{iso}$), wherein the insulation resistance ($R_{iso}$) is calculated according to $R_{iso}=U_B/(I_{PE}-I_{PE})$, wherein $I_{PE}$ is a current measured in the first current measurement, and $I_{PE'}$ is a current measured in the second current measurement, and wherein $U_B$ is a supply voltage over the positive node and the negative node.*

*18. The circuit according to claim 17, wherein the first switch and the second switch are embodied in a two way switch.*

*19. The circuit according to claim 17 wherein first switch or the second switch is a relay or a semiconductor switch.*

*20. A method for determining an insulating resistance ($R_{iso}$) of a circuit, the circuit having a first switch between a first node and an earth connection point and a second switch between a second node and the earth connection point, the circuit further comprising a current measuring element between the first node and the first switch, a constant current source between the second node and the second switch and a transistor disposed parallel to the first switch and the second switch, wherein an emitter or a source of the transistor is connected to the constant current source, and wherein a collector or a drain connection is connected to the current measuring element, the method comprising:*

*providing a supply voltage ($U_B$) between the first node and the second node;*

*measuring a first current including a current of the constant current source with the current measuring element, wherein the first current is measured when the first switch is closed and the second switch is open;*

*measuring a second current including the current of the constant current source with the current measuring element, wherein the second current is measured when the first switch is open and the second switch is closed; and*

*calculating the insulating resistance ($R_{iso}$) by a microcontroller or microprocessor based on the first current, the second current and the supply voltage ($U_B$).*

*21. The method according to claim 20, wherein the first switch and the second switch are embodied in a two way switch.*

*22. The method according to claim 20, wherein the first switch or the second switch is a relay or a semiconductor switch.*

*23. The method according to claim 20, wherein the first node is a positive node and the second node is a negative node.*

*24. The method according to claim 20, further comprising applying a constant current source supply voltage to the constant current source by the transistor, wherein the constant current source supply voltage is substantially smaller than the supply voltage ($U_B$).*

*25. A circuit having an earth connection point, a first node and a second node, the circuit comprising:*

*a first switch between the first node and the earth connection point;*

*a second switch between the second node and the earth connection point;*

*a current measuring element connected between the first node and the first switch and a constant current source connected between the second node and the second switch;*

*a transistor disposed parallel to the first switch and the second switch, wherein an emitter or a source of the transistor is connected to the constant current source, and wherein a collector or a drain connection is connected to the current measuring element; and*

*a microcontroller configured to perform a first current measurement when the first switch is closed and the second switch is open, and a second current measurement when the first switch is open and the second switch is closed, and the microcontroller further configured to calculate an insulation resistance ($R_{iso}$) based on the first current measurement and the second current measurement.*

*26. The circuit according to claim 25, wherein the first switch and the second switch are embodied in a two way switch.*

*27. The circuit according to claim 25, wherein the first switch or the second switch is a relay or a semiconductor switch.*

*28. The circuit according to claim 25, wherein the current measuring element is a shunt.*

*29. The circuit according to claim 25, wherein the first node is a positive node and the second node is a negative node.*

*30. A system comprising:*

*an inverter, the inverter having an earth connection point, a first node and a second node, the inverter comprising*

*a first switch between the first node and the earth connection point;*

*a second switch between the second node and the earth connection point;*

*a current measuring element connected between the first node and the first switch and a constant current source connected between the second node and the second switch;*

*a transistor disposed parallel to the first switch and the second switch, wherein an emitter or a source of the transistor is connected to the constant current source, and wherein a collector or a drain connection is connected to the current measuring element;*

*a microcontroller configured to perform a first current measurement when the first switch is closed and the second switch is open, and a second current measurement when the first switch is open and the second switch is closed, and the microcontroller further configured to calculate an insulation resistance ($R_{iso}$) based on the first current measurement and the second current measurement; and*

*a photovoltaic generator having a first generator terminal and a second generator terminal, wherein the first generator terminal is electrically connected to the first node, and wherein the second generator terminal is electrically connected to the second node.*

*31. The system according to claim 30, wherein the first switch and the second switch are embodied in a two way switch.*

*32. The system according to claim 30, wherein the first switch or the second switch is a relay or a semiconductor switch.*

*33. The system according to claim 30, wherein the first generator terminal and the first node are positive, and wherein the second generator terminal and the second node are negative.*

*34. The system according to claim 30, wherein the inverter is a transformerless inverter.*

* * * * *

UNITED STATES PATENT AND TRADEMARK OFFICE

CERTIFICATE OF CORRECTION

PATENT NO. : RE44,455 E
APPLICATION NO. : 13/212859
DATED : August 27, 2013
INVENTOR(S) : Mueller It is certified that error appears in the above-identified patent and that said Letters Patent is hereby corrected as shown below:

In the Claims:

In Col. 9, line 63, claim 17, delete " $R_{iso} = U_B /(I_{PE} - I_{PE})$ " and insert -- $R_{iso} = U_B /(I_{PE} - I_{PE'})$ --.

Signed and Sealed this
Eighth Day of October, 2013

Teresa Stanek Rea
*Deputy Director of the United States Patent and Trademark Office*